United States Patent [19]

Riemenschneider

[11] Patent Number: 4,812,885
[45] Date of Patent: Mar. 14, 1989

[54] CAPACITIVE COUPLING

[75] Inventor: Bert R. Riemenschneider, Murphy, Tex.

[73] Assignee: Texas Instruments Incorporated, Dallas, Tex.

[21] Appl. No.: 81,424

[22] Filed: Aug. 4, 1987

[51] Int. Cl.⁴ .............................................. H01L 29/78
[52] U.S. Cl. ..................... 357/23.5; 357/51; 357/59; 365/185
[58] Field of Search ................. 357/23.5, 23.6, 23.11, 357/41, 23.5, 51, 59 G; 365/185

[56] References Cited

U.S. PATENT DOCUMENTS

| | | | |
|---|---|---|---|
| 4,326,331 | 4/1982 | Guterman | 357/23.5 |
| 4,377,857 | 3/1983 | Tickle | 357/23.5 |
| 4,451,904 | 5/1984 | Sugiura et al. | 357/23.5 |
| 4,754,320 | 6/1988 | Mizutani | 357/23.5 |
| 4,769,786 | 9/1988 | Garnache | 357/23.6 |

FOREIGN PATENT DOCUMENTS

| | | | |
|---|---|---|---|
| 159272 | 3/1985 | Japan | 357/23.5 |
| 62-43179 | 2/1987 | Japan | 357/23.5 |

Primary Examiner—Andrew J. James
Assistant Examiner—Mark Prenty
Attorney, Agent, or Firm—Larry C. Schroeder; Leo N. Heiting; Melvin Sharp

[57] ABSTRACT

An upstanding sidewall conductor (38) is formed in a via (30) that is made in a thick oxide layer (28) to expose a polysilicon gate electrode (22). A thin insulator layer (42) is deposited over the sidewall conductor layer (38) and a central region (32) of the polysilicon electrode (22). A second conductive layer (44) is deposited in the via (30) so as to be in registry with the upstanding sidewall conductor (38) and the central region (32) of the polysilicon electrode (22). In this way, the capacitive coupling between electrode (22) and electrode (44) is enhanced.

12 Claims, 1 Drawing Sheet

CAPACITIVE COUPLING

TECHNICAL FIELD OF THE INVENTION

The present invention relates to improvements in the capacitive coupling between electrodes of integrated circuit capacitors, and more particularly relates to polysilicon capacitor electrodes formed in vias and having projecting sidewall conductor members.

BACKGROUND OF THE INVENTION

Polysilicon capacitors and electrodes are well known in the integrated circuitry art. In a conventional electrically programmable read-only memory (EPROM) or an erasable electrically-programmable read-only memory (EEPROM), polysilicon is used to form a floating gate electrode over a gate region, the floating gate electrode further being capacitively coupled to a connected gate electrode. Such floating gate electrodes are generally formed over a thin gate insulator layer and adjacent thicker field oxide layers. A second, thin gate insulator layer is deposited on, or grown from the polysilicon. The connected gate electrode, or control gate, which can be made out of various conductive materials such as polysilicon or metal, is then deposited over the floating gate.

For proper gate electrode operation, it is desirable to maximize the capacitance between the floating gate electrode and the connected gate electrode relative to the capacitance between the floating gate electrode and the gate region in the semiconductor layer. In the past, this has been done by controlling the thickness of the oxide layer between the floating gate electrode and the connected gate electrode. This method of controlling the relative capacitance values has, however, physical limits, especially as the size of the gates involved shrink. In an EPROM configuration, the polysilicon gate must be close enough to the semiconductor substrate in order to receive hot electrons by injection, and therefore, the capacitance between the floating gate electrode and the semiconductor substrate cannot be-diminished beyond a certain point. The capacitance between the connected electrode and the floating gate electrode can be increased by decreasing the thickness of the intervening insulator to approximately 350 angstroms or less, but it cannot be decreased beyond a certain limit because leakage through the insulator between the floating gate and the control gate will increase to the point of causing poor data retention.

Therefore, a need has arisen in the industry for a new method of improving the capacitive coupling of a floating gate electrode to an upper gate relative to the capacitance of the floating gate electrode and the semiconductor substrate. Further, a need has arisen in the industry to find methods of improving capacitive coupling in the face of shrinking areas that can be devoted to the fabrication of capacitors.

SUMMARY OF THE INVENTION

One aspect of the invention comprises apparatus for increasing capacitance between a pair of electrodes. A first, roughly flat electrode is provided that has a surface, the surface having a peripheral region and a central region. A first insulator layer covers the peripheral region of the first electrode and forms a sidewall that extends upwardly from the surface. A sidewall conductor layer is electrically coupled to the first electrode and is formed on the sidewall for at least a portion of its height. This sidewall conductor layer has an inwardly facing capacitive coupling surface that is opposed to the surface facing the sidewall.

A second insulator layer is formed over the central region and the coupling surface. Finally, a second electrode is formed adjacent the second insulator layer and is formed such that it is substantially in registry with the coupling surface of the sidewall conductor and the central region of the first electrode. In this manner, a capacitive coupling is achieved between the second electrode and the sidewall conductor, thereby increasing the total capacitance between the first and second electrodes. This provides a principal technical advantage of the invention.

The invention may be advantageously applied in the manufacture of a EEPROM or EPROM cell, wherein the first electrode is a floating gate electrode that is situated over a gate region in a semiconductor substrate. The semiconductor substrate further has first and second doped regions on either side of the gate region to form a memory transistor for the EPROM cell.

The invention may also be advantageously used in forming a capacitor on a dielectric or other support layer of an integrated circuit. In this instance, the first electrode is formed on the support layer, and the remaining structure is formed thereupon.

In another aspect of the invention, a method is provided for forming first and second electrodes having increased capacitance. A support layer is provided, which can be a semiconductor substrate in the case that an EPROM cell is desired to be fashioned, or it can be a layer of field oxide. In the instance of an EPROM cell, first and second doped regions are formed in the semiconductor substrate so as to be spaced from each other by a gate region. A layer of field oxide is grown over the semiconductor substrate, using for example a nitride oxidation mask to prevent oxidation of the gate region. After removal of the masking nitride and the underlying pad oxide, a thin layer of gate oxide is grown over the gate region. Next, a layer of conductive material such as polycrystalline silicon is deposited over the gate oxide and adjacent portions of the field oxide. The polysilicon layer is then etched in order to form the floating gate electrode.

Alternatively, the field oxide over the doped regions and the thin layer of oxide grown over the gate region can be grown differentially at the same time, without the use of a nitride mask.

Next, a thick insulator layer, such as a layer of oxide, is formed over the polysilicon electrode and adjacent regions, and a via is opened in this second oxide to an upper surface of the polysilicon electrode. Then, a further layer of conductive material, such as polysilicon, is deposited in the via and adjacent regions, and an anisotropic etch is performed on this polysilicon layer.

After this etch is performed, a technical advantage of the invention will appear in the form of a sidewall conductor layer that joins the polysilicon electrode at its base and extends upwardly along the second thick oxide sidewall. A thin oxide layer is grown or deposited over the sidewall conductor and a conductive layer is then deposited over this thin oxide layer. The conductive layer is then etched to form the upper gate electrode.

This invention improves the capacitive coupling between the floating gate and the control gate of an EPROM by forming a via in a thick insulator layer over the floating gate and depositing a conductive sidewall layer in electrical contact with the floating gate. A thin insulator is then deposited over the floating gate and sidewall. Then a connected control gate is deposited in the via. The added sidewall area increases the capacitive coupling between control and floating gate, without using additional area for the cell.

BRIEF DESCRIPTION OF THE DRAWINGS

Other aspects of the invention and their advantages can be discerned from the following detailed description in conjunction with the appended drawings, in which.

DETAILED DESCRIPTION

Figure 1:
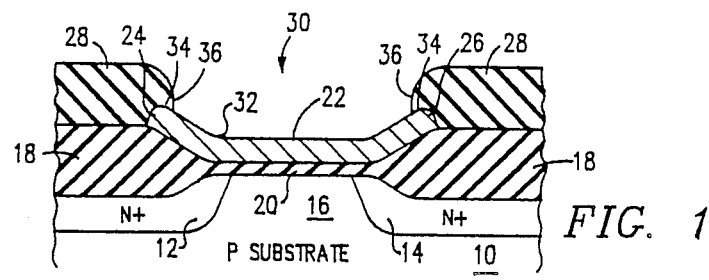
FIGS. 1-3 are successive highly magnified schematic cross-sectional views showing the fabrication of an EPROM cell according to the invention.
Figure 2:
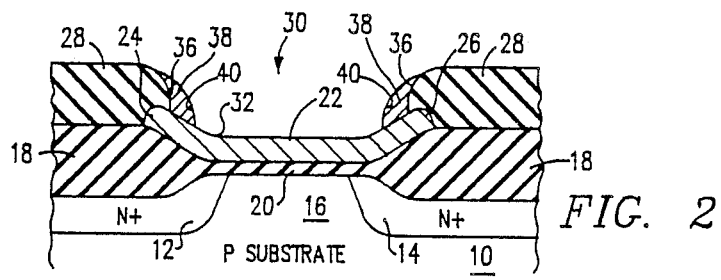
Figure 3:
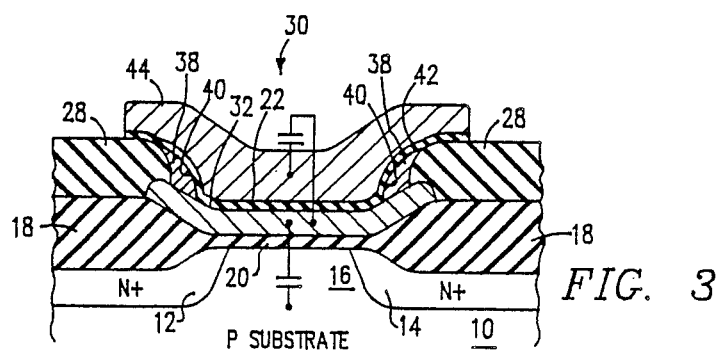

FIGS. 1-3 illustrate successive steps in the formation of an EPROM cell that employs the improved capacitive coupling structure of the invention. In FIG. 1 a semiconductor substrate, such as silicon, is indicated at 10. In the illustrated embodiment, the semiconductor substrate is initially doped to be p-type, although conductivity types can be reversed throughout. A source region 12 and a drain region 14 are then masked and implanted into substrate 10, regions 12 and 14 being n+−type in the instance that the semiconductor substrate is p-type. Doped regions 12 and 14 are spaced apart by a gate region 16 in the substrate.

A thick insulator layer 18, such as field oxide, is next grown from the semiconductor substrate along with a thin gate insulator layer 20 in a differential oxidation step. Gate insulator layer 20 is preferably on the order of 350 angstroms thick, while field oxide layer 18 will typically be on the order of 3600 angstroms. Alternatively an oxide pad (not shown) approximately 350 angstroms thick may be formed on substrate 10, and an approximately 1400 angstrom-thick layer of nitride (not shown) deposited on the oxide pad. The nitride is etched to leave a mask over the gate region 16. Oxide layer 18 is grown in all nonmasked areas in a LOCOS process. The nitride mask and underlying oxide pad is then stripped, and a fresh gate insulator layer 20 is formed over gate region 16.

Next, a doped polysilicon or other conductive layer is deposited on gate oxide layer 20 and adjacent exposed surfaces of field oxide layer 18. The preferably polysilicon gate electrode layer is then masked and etched to form a floating gate electrode 22. Floating gate electrode 22 is roughly flat in its section. Sloping portions 24 and 26 of electrode 22 are formed by ramping up the surfaces of the field oxide layer 18. The thickness of the floating gate electrode 22 is preferably about 3000 angstroms.

Next, a second, thick insulator layer 28, such as oxide, is deposited over floating gate electrode 22 and the adjacent area of layer 18. Then, a via indicated generally at 30 is opened into the insulator layer to expose a central region 32 of the upper surface of floating gate electrode 22. A peripheral surface 34 of electrode 22 remains covered by insulator layer 28. As can be seen, the opening of a via to central region 32 creates a continuous sidewall 36 that defines the boundary of the via.

Turning now to FIG. 2, further steps in fabricating a pair of capacitively coupled electrodes according to the invention are shown. A layer of conductive material, such as doped polycrystalline silicon, is next deposited across the surface of oxide layer 28 and inside via 30. Then, the poly layer is etched with an anisotropic etchant such as a combination HCl and HBr gas. Since this etch will act vertically, all of the polysilicon layer will be etched away except for a continuous sidewall conductor layer 38. The etch is terminated when the polysilicon is cleared from over oxide layer 28, and some of floating gate electrode 22 may be etched from the via also. However, proper etch control (about 10% overetch) would result in the loss on only 300 angstroms of the 3000 angstrom thick electrode 22.

Sidewall conductor layer 38 is preferably formed on sidewall 36 so as to be continuous and endless, and is joined at its base to floating gate electrode 22. Preferably, layer 38 extends for most or all of the height of sidewall 36. Typical height dimension for sidewall conductor 38 are greater than or equal to 0.5 microns. Sidewall conductor 38 has an interior coupling surface 40 that is opposed to sidewall 36.

Referring now to FIG. 3, the final stages in the fabrication of an EPROM cell according to the invention are shown. A thin interlevel insulator layer 42 is next deposited over insulator layer 28, coupling surface 40 of sidewall conductor 38, and the exposed central region 32 of the upper surface of polysilicon electrode 22. Thin insulator layer 42, which preferably is comprised of oxide, should be about 375 angstroms or less.

Finally, a control gate 44, which can be formed either of metal or poly, is deposited, patterned and etched so as to be in registry with both coupling surface 40 of sidewall conductor 38, and central region 32 of the upper surface of polysilicon electrode 22. Further passivating layers and contacts may then be formed (not shown).

As shown in FIG. 3, the floating gate electrode 22 will have a greater capacitance with upper electrode 44 than with gate region 16, due to the capacitive contribution of sidewall conductor 38. Little or no additional device area is necessary to acquire this additional capacitance.

Figure 4:
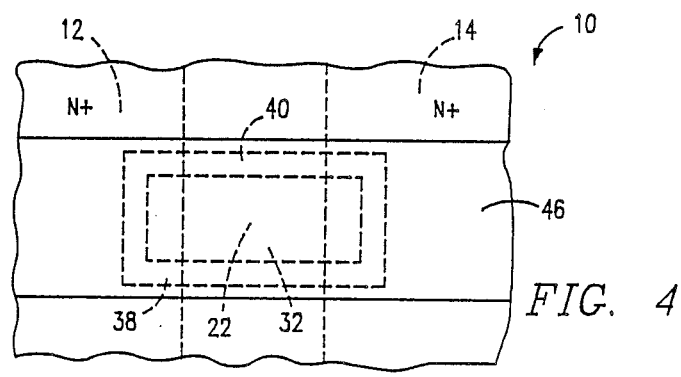
FIG. 4 is a magnified schematic plan view of another EPROM cell according to the invention.

Turning now to FIG. 4, a schematic plan view of a completed EPROM cell much like that of FIG. 3 is shown. Like numbers identify like parts wherever possible. Insulator layers have been omitted. As fabricated in an array, a source region 12 and a drain region 14 take the shape of elongated diffused strips within a semiconductor substrate indicated generally at 10. A word line 46, here constructed of polysilicon, corresponds to the control gate 44 shown in FIG. 3 and is the topmost layer shown. A polysilicon floating electrode 22 and a sidewall conductor 38 joined thereto are shown in phantom underneath word line 46.

In a preferred embodiment, the distance between doped regions 12 and 14 is approximately 1.5 microns, and the overlap of central region 22 and sidewall conductor 38 onto the doped regions 12 and 14 are 0.75 microns a piece, for a total length of the capacitively coupled area of 3.0 microns. In the shown embodiment, the width of the capacitively coupled area is somewhat less than the polysilicon word line, and in the shown embodiment is about 1.2 microns. As in the case of the EEPROM shown in FIG. 3, the sidewall conductor 38 is approximately 0.5 microns deep.

The first component of the capacitively coupled area is equal to the area of central region 32. This in turn is equal to approximately $3.0 \times 1.2$ microns, or 3.6 microns$^2$. The second, additional area for capacitive coupling is approximately equal to $0.5 \times 2 \times (3.0 + 1.2) = 4.2$ microns$^2$, or the area of coupling surface 40. The total area of the new capacitively coupled structure is 7.8 microns$^2$. In the same area, a previously developed capacitor the structure would have had dimensions of 1.5 microns $\times$ 3.0 microns, for a total of 4.5 microns$^2$. Thus, the invention provides a significant advantage in increasing the capacitively coupled area by 7.8/4.5, or by more than 70%.

Figure 5:
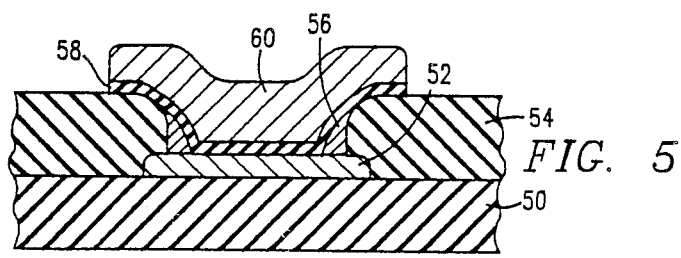
FIG. 5 is a highly magnified schematic cross-sectional view of an alternate embodiment of the invention wherein a simple capacitor is formed.

Turning now to FIG. 5, an alternate embodiment of the invention is shown, as employed to fabricate a capacitor on top of a field oxide layer. In this embodiment, a support layer is furnished by way of a thick field oxide layer shown at 50. A doped polysilicon electrode layer 52 is formed on the field oxide layer, and then a second, thick insulator layer 54 is deposited on the polysilicon electrode. A via is opened in thick oxide layer 54 to the upper surface of polysilicon electrode 52, and a second polysilicon layer is deposited in the via and adjacent regions. This second polysilicon layer is then patterned and anisotropically etched to create polysilicon sidewall layer 56, which runs continuously around the sidewall of the via. A thin insulator layer 58 is then formed over sidewall conductor 56 and the exposed central region of layer 52, and this is followed by the deposition of a polysilicon or metal second electrode 60. Second electrode 60 is deposited, patterned or etched so as to provide a maximum coupling to sidewall conductor 56 and polysilicon electrode layer 52. As shown, the invention is applicable in any instance where it is desired to form a capacitor in an integrated circuit.

In summary, a new method and apparatus for improving capacitive coupling has been shown and described. A via is opened to the usual polysilicon floating gate electrode or lower capacitor electrode, and an upstanding sidewall conductor is formed around the sidewall of the via. A control electrode is then formed in the via to be in registry with the upstanding sidewall and a central region of the polysilicon gate electrode. This provides an increase in the capacitively coupled area over conventional structures.

While preferred embodiments of the invention and their advantages have been described in detail in the above detailed description, the invention is not limited thereto, but only by the scope and spirit of the appended claims.

What is claimed is:

1. Integrated circuit structure with enhanced capacitance, comprising:
a first electrode having a surface with a peripheral region and a central region;
a first insulator layer covering said peripheral region and forming at least one sidewall extending upwardly from said surface and away from said central region;
a sidewall conductor layer physically coupled to said surface and overlying said sidewall for at least a portion of said sidewall's height, said sidewall conductor layer having a coupling surface;
a second insulator layer formed over said central region and said coupling surface; and
a second electrode formed adjacent said second insulator layer and substantially in registry with said coupling surface and said central region of said first electrode, such that a substantial capacitance is formed between said second electrode on the one hand and said sidewall conductor and said first electrode on the other.

2. The structure of claim 1, wherein said first insulator layer has greater thickness than the thickness of said first electrode, said second insulator layer being thinner than said first insulator layer.

3. The structure of claim 1, wherein said structure is formed at a face of a semiconductor layer and further comprises:
a semiconductor layer;
first and second spaced diffused regions formed in said semiconductor layer, a gate region formed between said first and second diffused regions; and
a gate insulator layer formed over said gate region, said first electrode having a second surface opposed to said surface and adjacent said gate insulator layer.

4. The structure of claim 3, wherein the capacitance between said first electrode and said sidewall conductor and said second electrode is greater than the capacitance between said first electrode and said gate region.

5. The structure of claim 3, wherein said first electrode is a floating gate electrode of an electrically programmable read-only memory.

6. The structure of claim wherein said first electrode and said sidewall conductor are formed of a similar conductive material.

7. The structure of claim 6, wherein said first electrode and said sidewall conductor are comprised of doped polycrystalline silicon.

8. The structure of claim 1, wherein said second electrode comprises doped polycrystalline silicon.

9. The structure of claim 1, wherein said second electrode is comprised of metal.

10. The structure of claim 1, wherein said first electrode is roughly flat.

11. A cell for an electrically programmable read-only memory, comprising:
a semiconductor layer;
a first doped region formed in said semiconductor layer, a second doped region formed in said semiconductor layer and laterally spaced from said first doped region, said first and second regions defining a gate region in said semiconductor layer therebetween;
a field insulator layer formed on said semiconductor layer, an orifice formed in said field insulator layer to said semiconductor gate region, a thin gate insulator layer formed within said orifice on said gate region;
a gate electrode formed on said gate insulator layer;
a second think insulator layer formed over said field insulator layer and said gate electrode, a via opened in said thick insulator layer to a central region of said gate electrode;
a sidewall conductor jointed to the periphery of said central region of said gate electrode and extending upwardly therefrom adjoining said thick insulator layer, said sidewall conductor defining an exposed central region of said gate electrode;
a second thin insulator layer formed over said sidewall conductor and said exposed central region of said gate electrode; and
a second electrode formed on said second insulator layer so as to be capacitively coupled to said sidewall conductor and said exposed central region.

12. The cell of claim 11, wherein said gate electrode and said sidewall conductor are formed of polycrystalline silicon.

* * * * *